United States Patent
Conradi

(10) Patent No.: US 8,462,315 B2
(45) Date of Patent: Jun. 11, 2013

(54) OPTICAL SYSTEM AND METHOD OF USE

(75) Inventor: Olaf Conradi, Westhausen/Westerhofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 393 days.

(21) Appl. No.: 12/432,921

(22) Filed: Apr. 30, 2009

(65) Prior Publication Data

US 2009/0231565 A1  Sep. 17, 2009

Related U.S. Application Data

(63) Continuation of application No. PCT/EP2008/000459, filed on Jan. 22, 2008.

(30) Foreign Application Priority Data

Jan. 22, 2007  (DE) .......................... 10 2007 004 723

(51) Int. Cl.
*G03B 27/52* (2006.01)

(52) U.S. Cl.
USPC .......................................................... 355/55

(58) Field of Classification Search
USPC ................................. 355/52, 55, 67
See application file for complete search history.

(56) References Cited

U.S. PATENT DOCUMENTS

| | | | |
|---|---|---|---|
| 4,540,251 A * | 9/1985 | Yau et al. .......................... 355/30 |
| 5,392,119 A | 2/1995 | McArthur et al. | |
| 5,710,620 A * | 1/1998 | Taniguchi ....................... 355/53 |
| 5,828,455 A | 10/1998 | Smith et al. | |
| 5,978,085 A | 11/1999 | Smith et al. | |
| 6,198,579 B1 | 3/2001 | Rupp | |
| 6,504,597 B2 | 1/2003 | Schuster et al. | |
| 7,817,249 B2 | 10/2010 | Uehara | |
| 8,111,378 B2 | 2/2012 | Uchikawa | |
| 2001/0019403 A1 | 9/2001 | Schuster et al. | |
| 2003/0235682 A1 * | 12/2003 | Sogard ............................ 355/52 |
| 2006/0114437 A1 | 6/2006 | Akhssay et al. | |
| 2006/0146662 A1 | 7/2006 | Ohkubo et al. | |
| 2006/0244940 A1 | 11/2006 | Uehara | |
| 2006/0256322 A1 * | 11/2006 | Bowes .......................... 356/124 |
| 2008/0204682 A1 | 8/2008 | Uehara et al. | |
| 2008/0236362 A1 | 10/2008 | Osuga | |
| 2008/0246933 A1 | 10/2008 | Uchikawa | |
| 2008/0310029 A1 | 12/2008 | Conradi et al. | |

FOREIGN PATENT DOCUMENTS

| | | |
|---|---|---|
| EP | 0 678 768 | 10/1995 |
| EP | 0 678 768 A2 | 10/1995 |
| EP | 1 231 517 | 8/2002 |
| EP | 1 376 092 | 1/2004 |

(Continued)

OTHER PUBLICATIONS

English translation of Chinese Office Action for corresponding CN Application No. 200880002851.2, dated Mar. 9, 2011.

(Continued)

*Primary Examiner* — Glen Kao
(74) *Attorney, Agent, or Firm* — Fish & Richardson P.C.

(57) ABSTRACT

A method for improving imaging properties of an optical system and an optical system of this type having improved imaging properties are described. The optical system can have a plurality of optical elements. In some embodiments, an optical element is positioned and/or deformed by mechanical force action and by thermal action. In certain embodiments, one optical element is positioned and/or deformed by mechanical force action and another optical element is deformed by thermal action.

32 Claims, 3 Drawing Sheets

FOREIGN PATENT DOCUMENTS

| | | |
|---|---|---|
| JP | 08-008178 A | 1/1986 |
| JP | 05-291117 | 11/1993 |
| JP | 06-267825 | 9/1994 |
| JP | 2001-505366 | 4/2001 |
| JP | 2005-353968 | 12/2005 |
| JP | 2006-157020 | 6/2006 |
| JP | 2006-189570 | 7/2006 |
| JP | 2008-241861 | 10/2008 |
| WO | WO 98/25182 | 6/1998 |
| WO | WO 99/67683 | 12/1999 |
| WO | WO 2005/022614 | 3/2005 |
| WO | WO 2005/078774 | 8/2005 |
| WO | WO 2007/000984 | 1/2007 |
| WO | WO 2007/017089 | 2/2007 |

OTHER PUBLICATIONS

Japanese Office Action for corresponding JP Appl No. 2009-546682, dated May 28, 2012.

Chinese Office Action, for corresponding CN Appl No. 200880002851.2, dated Mar. 22, 2012.

International Search Report for the corresponding PCT Application No. PCT/EP2008/000459, bearing the date Mar. 7, 2008.

International Preliminary Report on Patentability for the corresponding PCT Application No. PCT/EP2008/000459, bearing the date Jul. 28, 2009.

Office Action mailed on Dec. 14, 2012, for Chinese Patent Application CN200880002851.2, with English translation.

\* cited by examiner

OPTICAL SYSTEM AND METHOD OF USE

CROSS-REFERENCE TO RELATED APPLICATIONS

This application is a continuation of, and claims priority under 35 U.S.C. §120 to, international application PCT/EP2008/000459, filed Jan. 22, 2008, which claims benefit of German application 10 2007 004 723.3, filed Jan. 22, 2007. International application PCT/EP2008/000459 is hereby incorporated herein in its entirety.

FIELD

The disclosure generally relates to optical systems and methods of using optical systems, which provide improved imaging properties of an optical system.

BACKGROUND

Optical systems include, for example, projection objectives in semiconductor lithography for fabricating finely patterned components. Optical systems of this type typically have a plurality of optical elements, which can be formed, for example, as lenses, mirrors or plane-parallel plates having a wide variety of reflection/refraction properties. A projection objective is commonly used to image a structure or a pattern of a mask (reticle) onto a light-sensitive substrate. The structure arranged in the object plane of the optical system is usually illuminated by an illumination source and its associated illumination optical assembly. The light transmitted through the structure can be directed through the optical system and expose the light-sensitive substrate arranged in the image plane of the optical system.

The imaging quality of an optical system is often impacted by imaging aberrations occurring in the optical system, such as, for example, areas resulting from aberrations. Such imaging aberrations can be thermally induced during the operation of the optical system by at least one optical element of the optical system being heated and altering the imaging properties of the optical system. Owing to the heating of the at least one optical element, an irreversible, radiation-dictated alteration of the material of the at least one optical element can occur. By way of example, an alteration of the density of the material (compaction) leads to a local change in the refractive index of the optical element. Furthermore, it is possible that a temporary, reversible alteration of the material of the optical element in the form of a change in refractive index or else a geometrical deformation can occur and can influence the imaging properties of the optical system. Depending on the illumination mode of the optical system, the heating of the at least one optical element can be rotationally symmetrical or non-rotationally symmetrical relative to the optical axis of the optical system. Non-rotationally symmetrical heating is brought about, for example, by dipole illumination produced by a mask or a grating in the illumination optical assembly.

SUMMARY

In some embodiments, the disclosure provides a method for improving imaging properties of an optical system with which imaging aberrations of the optical system can be effectively reduced in a short time. In certain embodiments, the disclosure provides an optical system that can be used in such a method.

In one aspect, the disclosure provides a method that can improve imaging properties of an optical system. The optical system has a plurality of optical elements. In some embodiments, at least one of the optical elements is positioned and/or deformed by mechanical force action and by thermal action. In certain embodiments, at least one element is positioned and/or deformed by mechanical force action, and at least one other optical element is deformed by thermal action.

In another aspect, the disclosure provides an optical system that can provide improved imaging properties. The optical system has a plurality of optical elements. The plurality of optical elements are assigned a plurality of manipulators for positioning and/or for actively deforming the plurality of optical elements. At least one manipulator is a mechanical manipulator, and at least one other manipulator is a thermal manipulator.

In general, the mechanical force actions and the thermal actions are produced by mechanical and thermal manipulators, respectively.

Mechanical positioning and/or deformation and thermal deformation of the optical element(s) can lead to a changed wavefront profile of the optical system, such that at least one imaging aberration can be at least partly corrected.

As used herein, a mechanical/thermal deformation of an optical element should be understood to mean an optical alteration of its properties, in particular of its geometry and/or of its material properties, such as, for example, refractive index, coefficient of thermal expansion or the like.

As referred to herein, mechanical positioning of an optical element is to be understood as a displacement along or transverse the optical axis, a rotation about the optical axis and/or a tilt.

The optical elements can be, for example, lenses, mirrors or plane-parallel plates having a wide variety of refraction and reflection properties.

Positioning and/or deformation of optical elements by mechanical force action and deformation by thermal action can advantageously result in two different possibilities for correcting basic orders and higher orders of imaging aberrations of the optical system. Both ways of deforming or positioning an optical element are sufficiently known and can be used in a well controllable and targeted manner for correcting wavefront aberration profiles of the optical system.

It can be advantageous to thermally deform an optical element when a mechanical deformation would lead to damage to the optical element or its mount. The thermal deformation of the optical element can thus enable a correction of imaging aberrations which may not be permitted by a simple mechanical deformation.

Simultaneously mechanical positioning and/or deformation and thermal deformation of optical elements can reduce the time involved for a correction of imaging aberrations.

In some embodiments, an optical element is positioned and/or deformed by mechanical force action and deformed by thermal action in temporally superposed fashion. In certain embodiments, one optical element is positioned and/or deformed by mechanical force action, and, in temporally superposed fashion, another optical element is deformed by thermal action. In such embodiments, complicated wavefront aberration profiles of the optical system can be optimally corrected in the interaction of a mechanically and a thermally induced manipulation of an optical element.

In certain embodiments, an optical element is positioned and/or deformed by a temporally constant mechanical force action. In such embodiments, the mechanical force action can be provided in a simple and readily controllable manner. The correction effect of a temporally constant mechanical force action on optical elements is sufficiently known and can therefore be fairly well predicted. Furthermore, the desired technical properties for mechanical manipulators which produce a temporally constant mechanical force action can be less stringent than in the case of those manipulators which produce a temporally variable mechanical force action.

In some embodiments, one or more optical elements are deformed by temporally variable thermal action, such as, for example, by temporally linearly rising thermal action. In such embodiments, the thermal action can be optimally adapted to the temporally variable wavefront aberration profiles of the optical system. The imaging aberrations of the optical system can be corrected particularly well this way.

In certain embodiments, the mechanical force action for positioning and/or deforming an optical element is adjusted and/or varied in a time duration of less than 1 sec (e.g., less than 500 msec, less than 100 msec).

In some embodiments, in the optical system, a mechanical manipulator is assigned a controller which can actuate the mechanical manipulator in a time duration of less than 1 sec (e.g., less than 500 msec, less than 100 msec) for adjusting and/or varying the mechanical force action. After each of such time durations, the manipulator can be in a rest state.

In certain embodiments, the at least one mechanical manipulator is triggered for a minimum time duration only, in order to adjust the desired force action (e.g., to position and/or deform the first optical element), and just thereafter, the actuation of the mechanical manipulator can be interrupted so that an adjusted mechanical force action is reached. This adjusted mechanical force action can be constant and may have a value of greater than zero or approximately equal to zero. These short-time actuations of the mechanical manipulator can have the advantage that oscillations or vibrations generated by the actuation of the mechanical manipulator can decay before the optical system, such as a projection objective for microlithography, is used for exposing a substrate. The substrate, also referred to as a wafer, is divided into a plurality of single areas also referred to as "die". Each die is usually separately exposed one after the other. The afore-mentioned measure can help assure that the oscillations generated by the actuation of the mechanical manipulator are decayed before a die exposure is commenced.

In some embodiments, the mechanical force action for positioning and/or deforming the first optical element is adapted in time intervals $\Delta t_{mech}$. This configuration represents the case of an adjustment and/or variation of the mechanical force action on the first optical element in time intervals. The time intervals $\Delta t_{mech}$ can be adapted to the time intervals of the exposure of the single dies. In other words, the mechanical manipulator can be triggered die by die, to adapt the position and/or deformation of an optical element to the imaging correction involved due to the heating of the optical elements of the system.

In certain embodiments, a controller actuates a mechanical manipulator in time intervals $\Delta t_{mech}$, accordingly. The time intervals $\Delta t_{mech}$ of the triggering or actuation of the mechanical manipulator can be greater than the time duration of the actuation itself, and can be, in the average, in the range of 1 to 5 sec, which can, for example, correspond to the time interval of the single exposure of each single die.

In some embodiments, the thermal action on one or more optical elements is carried out continuously. Differently from the mechanical manipulator, a thermal manipulator is generally not subject to the problem of oscillations and vibrations. In certain embodiments, therefore, the thermal manipulator can be actuated continuously, which can shorten thermal time constants. But even in case of the thermal manipulator it can be desirable to carry out the thermal action on the one or more optical elements in time intervals $\Delta t_{therm}$.

In certain embodiments, a thermal manipulator is assigned a controller that can actuate the thermal manipulator continuously or in time intervals $\Delta t_{therm}$.

Optionally, the time intervals $\Delta t_{mech}$ and $\Delta t_{therm}$ of the actuation of the mechanical force action and the thermal action are selected such that the ratio $\Delta t_{therm}/\Delta t_{mech}$ is in the range from 0 to about 10. The value 0 means a continuous actuation of the thermal manipulator. A value of about 1 means an actuation of the mechanical manipulator and the thermal manipulator in equal time intervals, for example die by die. A value of larger than 1, such as, for example 7 to 10, can mean that the thermal manipulator is actuated for the time duration of a complete wafer exposure (the actuation of the thermal manipulator is not interrupted after each single exposure of a single die, while this is still the case for the mechanical manipulator).

In some embodiments, the thermal action is carried out in such a way that it produces a rotationally symmetrical temperature distribution in one or more optical elements. In such embodiments, imaging aberrations of the optical system which are based on a rotationally symmetrical heating of the optical elements can be corrected because of the rotationally symmetrical temperature distribution established in the optical element(s).

In certain embodiments, the thermal action is carried out in such a way that it produces a non-rotationally symmetrical temperature distribution in one or more optical elements. In such embodiments, imaging aberrations of the optical system which are based on a non-rotationally symmetrical heating of the optical elements, such as are produced, for example, by illumination poles, can be corrected by the non-rotationally symmetrical temperature distribution induced in the optical element(s).

In some embodiments, the thermal action is carried out in such a way that it produces a temperature change in an edge region of the at least first optical element and/or of the at least second optical element. This can be advantageous because the temperature change is provided in the optically unused region of the optical elements. Proceeding from the edge regions, the induced temperature change can expand in the entire optical elements.

In certain embodiments, the mechanical force action is carried out in such a way that it extends a range of effect of the thermal action. This can provide greater deformation relative to an only mechanically induced or only thermally induced deformation of the optical element.

In some embodiments, the mechanical force action and the thermal action are carried out in such a way that they minimize a time period between an actual and desired correction of one or more imaging aberrations. In such embodiments, the at least partial correction of the imaging aberration(s) can be effected rapidly. This can reduce maintenance times during the operation of the optical system.

In certain embodiments, one or more imaging aberrations is determined before the at least partial correction of the imaging aberration(s). In such embodiments, the imaging aberration(s) can be optimally improved based on the knowledge of the imaging aberration(s).

In certain embodiments, one or more imaging aberrations is determined by direct measurement of a wavefront profile. In such embodiments, the imaging aberration can be determined in a relatively simple manner without further technical outlay.

In some embodiments, one or imaging aberrations is determined by estimation of a field- and diffraction-angle-dependent light distribution in the optical system. This can allow for determining the imaging aberration(s) in a relatively simple manner. The estimation of the light distribution in the optical system can involve knowledge of layer and volume absorption coefficients of the optical elements. The intensity absorbed in the optical elements and the temperature distribution of the optical elements can be determined on the basis of the mode of illumination of the structure by the illumination source and illumination optical assembly. The coefficients of thermal expansion and the refractive indices of the optical elements can be calculated therefrom to deduce the wavefront aberration profile of the optical system.

In certain embodiments, one or more imaging aberrations is determined by comparison of the field- and diffraction-angle-dependent light distribution in the optical system with the field- and diffraction-angle-dependent light distribution of reference measurements. This can allow for determining the imaging aberration(s) in a relatively simple manner. Since the imaging aberrations of the reference light distributions are known, the imaging aberration(s) of the optical system can be deduced directly.

In some embodiments, one or more imaging aberrations is determined by measurement of the field- and diffraction-angle-dependent light distribution in at least one plane of the optical system by a detector. This can allow for determining the imaging aberration(s) of the optical system in a relatively simple manner. The measurement of the light distribution can be done before a substrate exposure. Optionally, a detector, such as, for example, a CCD camera, can be used. The light distribution can be measured e.g. in a plane of the optical system which is a plane near the pupil, a plane near the field and/or an intermediate plane.

In certain embodiments, a temporal development of one or more imaging aberrations is detected after the imaging aberration(s) has been determined and before the at least partial correction of the imaging aberration(s) is carried out. This can allow the imaging aberration(s) to be optimally corrected on the basis of the knowledge of imaging aberrations occurring in the future.

In some embodiments, knowledge of one or more imaging aberrations is used to determine the temporal development of the imaging aberration(s). In such embodiments, the future temporal development of the imaging aberration(s) can be predicted very precisely based on the present imaging aberration. Furthermore, it is possible in addition to take account of imaging aberrations that have already occurred at earlier points in time in the prediction of the temporal development of the imaging aberration(s) such that the temporal development can be predicted even more precisely.

In certain embodiments, the best possible correction that can be achieved is determined for at least partly correcting one or more imaging aberrations. This can allow the imaging aberration to be optimally corrected with the inclusion of all possible corrections that can be carried out.

In some embodiments, the disclosure provides an optical system that can be used in the methods disclosed herein to improve the imaging properties of the optical system.

Further advantages and features will become apparent from the following description and the drawings.

It goes without saying that the features mentioned above and those yet to be explained below can be used not only in the combinations specified, but also in other combinations or by themselves, without departing from the scope of the present disclosure.

BRIEF DESCRIPTION OF THE DRAWINGS

The disclosure is explained and described in more detail below on the basis of some selected exemplary embodiments in association with the drawings, in which.

DETAILED DESCRIPTION

Figure 1:
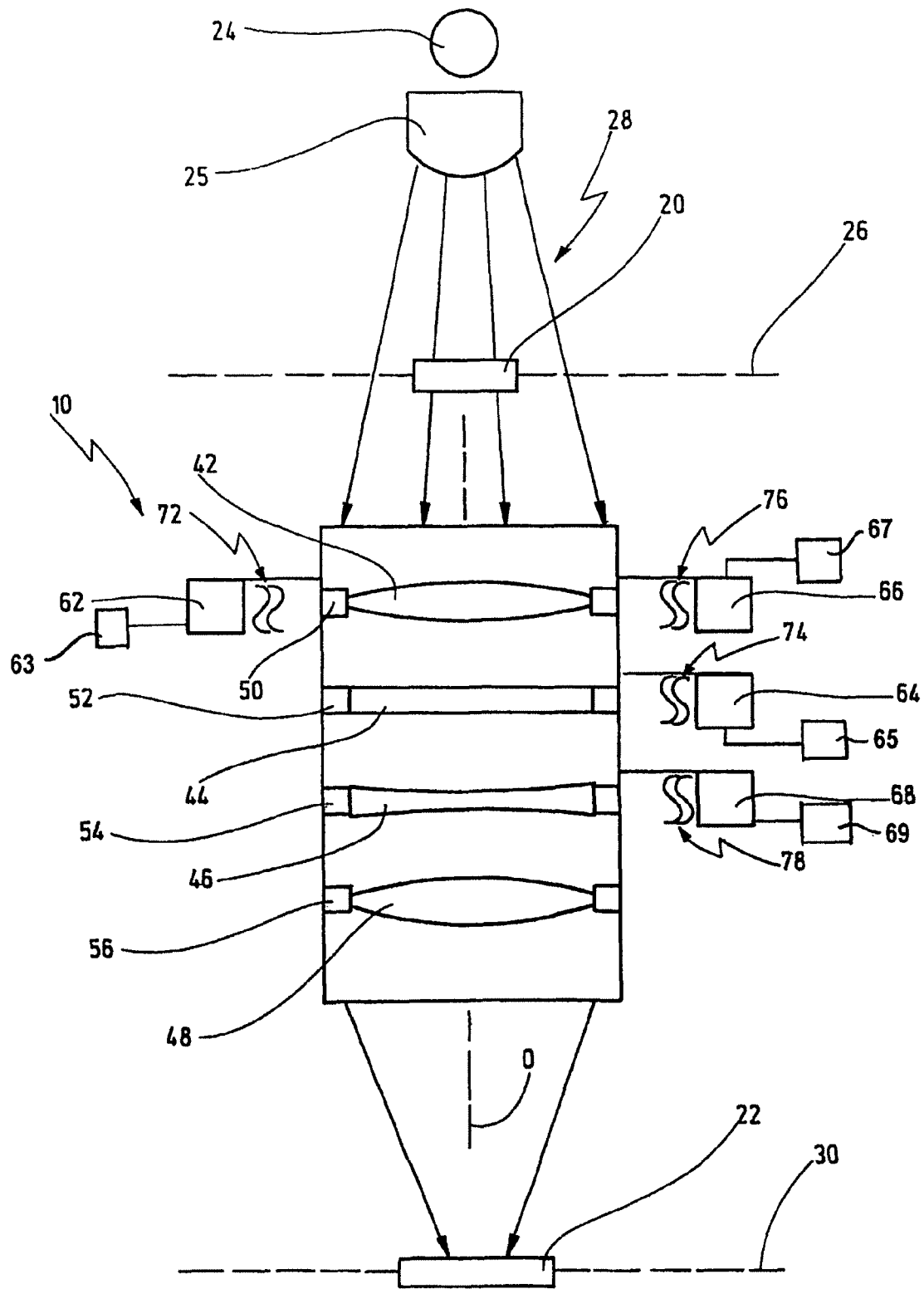
FIG. 1 shows a schematic illustration of an optical system during an exposure of a substrate.

FIG. 1 illustrates an optical system, which is provided with the general reference symbol 10 and which permits an imaging of a structure 20 or a pattern of a mask (reticle) onto a light-sensitive substrate 22.

An optical system 10 of this type can be used as a projection objective for fabricating finely patterned components in microlithography.

An illumination source 24, which is assigned an illumination optical assembly 25, illuminates the structure 20 arranged in an object plane 26 of the optical system 10. Light beams 28 are transmitted through partial regions of the structure 20 and impinge on the optical system 10. The optical system 10 images the structure 20 in demagnified fashion onto the light-sensitive substrate 22 arranged in an image plane 30 of the optical system 10.

The optical system 10 has a plurality of optical elements, in the schematic illustration four optical elements 42-48, which can be formed as lenses, mirrors or plane-parallel plates having a wide variety of refraction and reflection properties. Each optical element 42-48 is accommodated in a respective mount 50-56 in the optical system 10.

During the operation of the optical system 10, at least one imaging aberration can occur as a result of heating of one or more optical elements 42-48. Because of the heating, material properties of the optical elements 42-48 can change irreversibly in a manner dictated by radiation. By way of example, the density of the optical elements 42-48 can change (compaction, rarefaction), such that refractive indices or coefficients of thermal expansion of the optical elements 42-48 are altered as a result. Furthermore, the heating of the optical elements 42-48 can lead to a temporary alteration of geometry and material properties.

The heating of the optical elements 42-48 can occur rotationally symmetrically or non-rotationally symmetrically relative to an optical axis O of the optical system 10. Instances of non-rotationally symmetrical heating are brought about, for example, by a mask or a grating in the illumination optical assembly 25, wherein illumination poles for the optical system can be produced thereby.

Methods are provided herein to improve the imaging properties of the optical system 10 by correcting at least one imaging aberration of the optical system 10.

The optical system 10 has a plurality of manipulators, in the schematic illustration four manipulators 62-68, which are assigned to the plurality of optical elements. The manipulators 62-68 can be formed as mechanical manipulators 62-64 or as thermal manipulators 66-68.

By way of example, an optical element 42 can be assigned at least one mechanical manipulator 62 and at least one thermal manipulator 66. Furthermore, it is possible for in each case at least one mechanical manipulator 64 or at least one thermal manipulator 68 to be assigned to a respective optical element 44, 46 and to act on the optical element 44, 46.

The manipulators 62-68 serve for at least partly correcting at least one imaging aberration of the optical system 10. Each mechanical manipulator 62, 64 can have one more actuators that act on the optical element 42, 44 and produce a mechanical force action 72, 74 on the optical element 42, 44. The optical element 42, 44 is thereby positioned or mechanically deformed, wherein in case of a deformation it is altered optically with regard to its properties, in particular its geometry and/or its material properties such as, for example, the refractive index or the like. A positioning of the optical element 42, 44 does not result in an alteration of the geometry or the material properties of the optical element 42, 44, but a positioning here means a displacement of the optical element 42, 44 in direction or transverse the direction of the optical axis O, a rotation of the optical element 42, 44 about the optical axis O and/or a tilt of the optical element 42, 44 about an axis perpendicular to the optical axis O.

The mechanical force action 72, 74 can act at any desired regions of the optical element 42, 44. Furthermore, it commences immediately after the start-up of the mechanical manipulators 62, 64 and acts, after actuation, in temporally constant fashion, wherein the mechanical force action then can have a value of greater than zero or approximately equal to zero.

The mechanical manipulators 62, 64 can include actuators for a deformable lens element in order to correct imaging aberrations having a waviness in 2nd order, or actuators for positioning the optical element 42, 44.

The mechanical manipulators 62, 64 are actuated for a short time duration only, in order to adjust and/or vary the desired mechanical force action. This time duration is in the range of less than about 1 sec (e.g., less than 500 msec, less than 100 msec). This time duration is sufficient, because the mechanical manipulator 62, 64 acts instantaneously (its time constants for adjusting and/or varying the desired mechanical force action are minimal).

The mechanical manipulators 62, 64 can be actuated or triggered whenever the exposure of the substrate 22 is just interrupted. The substrate 22, also referred to as wafer, is, on its surface to be exposed, divided into a plurality of dies to be exposed one after the other, and the mechanical manipulators 62, 64 can be triggered at the time when the exposure of one die is completed and before the exposure of the next die commences. The mechanical manipulators 62, 64 are, thus, triggered in time intervals $\Delta t_{mech}$, in order to adjust and/or vary the respective desired mechanical force action on the optical element 42, 44, wherein these time intervals can correspond to the time intervals of the exposure between subsequent dies. The time intervals $\Delta t_{mech}$ can be in the range of 1 to 5 sec, and can be, for example, about two secs.

In an example, the mechanical manipulators 62, 64 are assigned controllers 63, 65 which control the actuation of the mechanical manipulators 62, 64 in a timed manner. The controllers 63, 65 actuate the manipulators 62, 654 in time intervals $\Delta t_{mech}$ for a short time duration only as described before.

The thermal manipulators 66, 68 produce a thermal action 76, 78 on the optical element 42, 46. The optical element 42, 46 is thereby thermally deformed by heating/cooling of its partial regions. A thermally induced deformation of the optical element 42, 46 should be understood to mean a temperature-dictated alteration of its properties, in particular the change in its geometry and/or its material properties such as, for example its coefficient of thermal expansion and its refractive index.

In some embodiments, the thermal manipulators 66, 68 can be formed as heating wires, Peltier elements or in accordance with the principle of a heat pump. The thermal manipulators 66, 68 can be designed in such a way that they induce a temperature distribution of the optical elements 42, 46 that is to be produced can be supplied by sources and sinks.

The thermal manipulators 66, 68 are also assigned controllers 67, 69.

Furthermore each manipulator 62-68 can be driven individually in each case. It is likewise possible for all the manipulators 62-68 to be driven jointly or in different combinations with one another.

In certain embodiments, the mechanical 62 and the thermal manipulator 66 are used in temporally superposed fashion, such that the mechanical force action 72 and the thermal action 76 act on the optical element 42 in temporally superposed fashion. It is likewise possible for the mechanical manipulator 64 and the thermal manipulator 68, which are assigned to the different optical elements 44, 46, to be used in temporally superposed fashion, such that the mechanical force action 74 and the thermal action 78 act simultaneously on the optical elements 44, 46. Consequently, a mechanical positioning and/or deformation and a thermally induced deformation of the respective optical elements 42-46 occurs simultaneously and changes the imaging properties of the optical elements. This extends a region of effect of the thermal manipulators 66, 68, since a region of effect of the mechanical manipulators 62, 64 is added to the region of effect of the thermal manipulators 66, 68.

The thermal manipulators 66, 68 can be triggered by the controller 67, 69 in a continuous manner or in time intervals $\Delta t_{therm}$ which can approximately correspond to the time intervals $\Delta t_{mech}$, or which can be larger than $\Delta t_{mech}$ by a factor of about 10. In general, the thermal manipulators 66, 68 and the mechanical manipulators 62, 64 are triggered in time intervals $\Delta t_{therm}$ and $\Delta t_{mech}$ such that the ratio $\Delta t_{therm}/\Delta t_{mech}$ is m the range from 0 to about 10, wherein the value 0 means a continuous triggering of the thermal manipulators 66, 68. A value of $\Delta t_{therm}/\Delta t_{mech} \approx 1$ means a triggering of the thermal manipulator 66, 68 in the time intervals of the single die exposures which are carried out one after the other. A value of this ratio of larger than 1 and up to about 10 means an actuation of the thermal manipulator 66, 68 for the time duration of the complete exposure of the substrate 22 (actuation of the thermal manipulator 66, 68 wafer by wafer).

If the mechanical manipulators 62, 64 and the thermal manipulators 66, 68 simultaneously act on the optical elements 42-48, then a time period between an actual and a desired correction 84 of the at least one imaging aberration is reduced. The mechanically induced positioning and/or deformation of the optical elements 42, 44 is added to the thermally induced deformation of the optical elements 42, 46, such that the obtainable desired deformation of the optical elements 42, 46 can be smaller and is achieved more rapidly in contrast to a sole effect of the thermal manipulators 66, 68.

Figure 2:
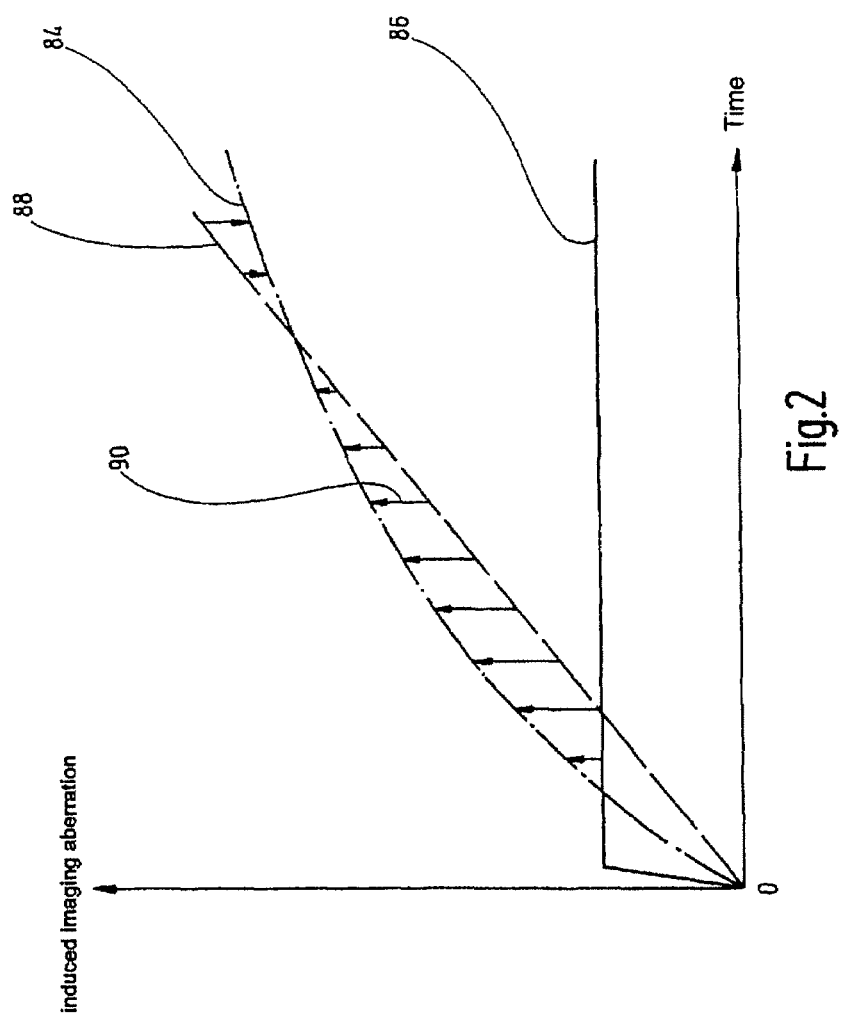
FIG. 2 shows a schematic illustration of an at least partial correction of at least one imaging aberration.

FIG. 2 shows an example of a temporal profile of the at least partial correction of the at least one imaging aberration of the optical system 10, wherein an imaging aberration induced by mechanical manipulators 62, 64 or thermal manipulators 66, 68 is plotted against time. The induced imaging aberration at least partly compensates for the at least one imaging aberration of the optical system 10.

The intended desired correction 84 of the at least one imaging aberration of the optical system 10 is obtained by a correction 86 and a correction 88. The correction 86 results from the positioning and/or deformation of the optical elements 42, 44 by the mechanical manipulators 62, 64. The correction 88 results from the deformation of the optical elements 42, 46 by the thermal manipulators 66, 68.

The correction 86 commences immediately after the start-up of the mechanical manipulators 62, 64, and it is temporally constant, until the mechanical manipulators are triggered again. The correction 88 of the at least one imaging aberration increases linearly with time. The desired correction 84 results from the corrections 86, 88 combined with one another, which is indicated by arrows 90.

Figure 3:
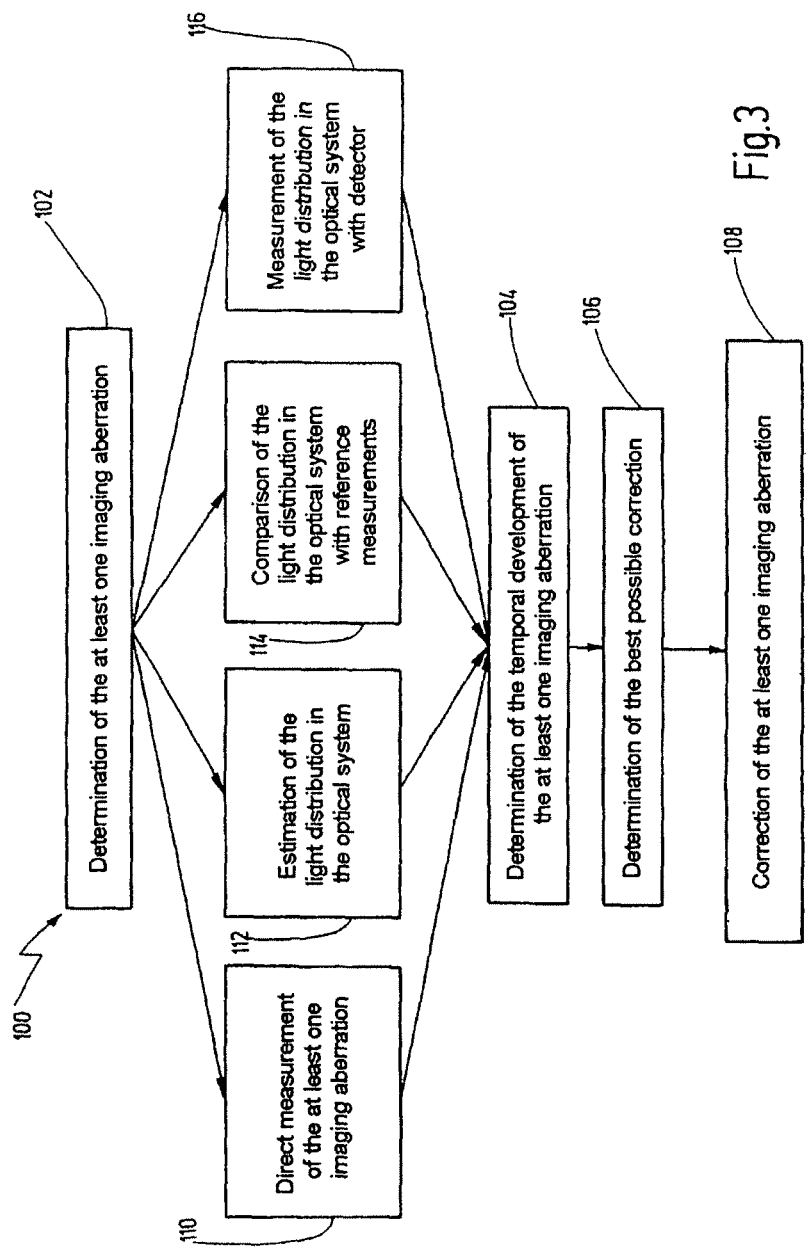
FIG. 3 shows a flowchart of a method that can improve imaging properties of an optical system.

The at least partial correction of the at least one imaging aberration is carried out during a method 100 for improving imaging properties of an optical system 10 (see FIG. 3). The method 100 has the method steps 102-108, a determination of the at least one imaging aberration, a determination of a temporal development of the at least one imaging aberration, a determination of a best possible correction and an at least partial correction of the at least one imaging aberration.

The individual method steps 102-108 of the method 100 can be carried out in each case individually or in different combinations with one another.

The method step 102, the determination of the at least one imaging aberration, can be carried out by substeps 110-116, wherein the latter can also be used in combination. The substep 110 is based on a direct measurement of the at least one imaging aberration. For this purpose, it is possible to use a wavefront detector such as is illustrated e.g. in EP 1 231 517 A1, U.S. Pat. No. 5,978,085 A1, U.S. Pat. No. 5,392,119 A1 or U.S. Pat. No. 5,828,455 A1.

Furthermore, by substep 112, the field- and diffraction-angle-dependent light distribution in the optical system 10 can be estimated on the basis of the mode of illumination of the structure 20 by the illumination source 24 and the illumination optical assembly 25. In this case, the intensity absorbed in the optical elements 42-48, that is to say the temperature distribution thereof, is determined based on knowledge of layer and volume absorption coefficients of the optical elements 42-48. The resulting coefficients of thermal expansion or the resulting temperature-dependent change in refractive index of the optical elements 42-48 and the effects thereof on the overall wavefront of the optical system 10 can thus be calculated.

The substep 114 for determining imaging aberrations is effected by a comparison of the field- and diffraction-angle-dependent light distribution in the optical system with a field- and diffraction-angle-dependent light distribution of reference measurements.

Furthermore, the method step 102 for determining imaging aberrations can be carried out by the substep 116, the measurement of a light distribution in one or more planes of the optical system 10 e.g. before a substrate exposure. In some embodiments, the measurement of the light distribution is carried out by a detector, for example a CCD camera. In accordance with the substep 112, the imaging aberrations of the optical system 10 can be deduced by the measured light distribution. The measurement of the light distribution can be performed near the pupil and/or near the field and/or at intermediate positions of the optical system 10.

After the method step 102, the determination of the at least one imagining aberration, the method step 104, the calculation of the temporal development of the at least one imaging aberration, is carried out. This method step 104 can include a knowledge of the at least one imaging aberration at preceding points in time. Optionally, the temporal development of the at least one imaging aberration can be calculated up to a few hours in advance.

The method step 106, the calculation of the best possible correction of the at least one imaging aberration of the optical system 10, takes account of a duration for which the at least one imaging aberration of the optical system 10 is intended to be at least partly corrected. In this case, the optimum correction that can be achieved can be carried out by optimization of a quadratic norm of different imaging aberrations at different points in time, the optimization of an integral value at different points in time, such as e.g. of the rms value of the wavefront, or by an optimization of corresponding maximum norms.

The method step 108, the at least partial correction of the at least one imaging aberration, can be carried out, as explained above, by a mechanical force action 72, 74 and a thermal action 76-78.

What is claimed is:

1. A method of using a semiconductor lithography system comprising an optical element, a mechanical manipulator and a thermal manipulator, the method comprising:
    i) at least partially correcting at least one imaging aberration of the system while using the system to sequentially expose a plurality of dies of a wafer to light, wherein during i):
        a) mechanical force action generated via the mechanical manipulator is used to position and/or deform the optical element only when the system is not exposing a die of the wafer to light; and
        b) thermal action generated via the thermal manipulator is constantly used to deform the optical element.

2. The method of claim 1, wherein the thermal action is temporally variable.

3. The method of claim 1, wherein the mechanical force action is adjusted and/or varied in a time duration of less than 1 second.

4. The method of claim 1, wherein the mechanical force action is adapted in time intervals.

5. The method of claim 1, wherein the mechanical force action is adapted in time intervals having a first value, the thermal action is actuated in time intervals having a second value, and a ratio of the second value to the first value is from 0 to about 10.

6. The method of claim 1, wherein the thermal action produces a rotationally symmetrical temperature distribution in the optical element.

7. The method of claim 1, wherein the thermal action produces a non-rotationally symmetrical temperature distribution in the optical element.

8. The method claim 1, wherein the thermal action produces a temperature change in an edge region of the optical element.

9. The method of claim 1, wherein the mechanical force action extends a range of effect of the thermal action.

10. The method of claim 1, wherein the mechanical force action and the thermal action minimize a time period between an actual and desired correction of the at least one imaging aberration.

11. The method of claim 1, wherein the at least one imaging aberration is determined before performing a) and/or b).

12. The method of claim 11, wherein the at least one imaging aberration is determined by direct measurement of a wavefront profile.

13. The method of claim 11, wherein the at least one imaging aberration is determined by estimation of a field- and diffraction-angle-dependent light distribution in the system.

14. The method of claim 11, wherein the at least one imaging aberration is determined by comparison of the field- and diffraction-angle-dependent light distribution in the system with the field- and diffraction-angle-dependent light distribution of reference measurements.

15. The method of claim 11, wherein the at least one imaging aberration is determined by measurement of the field- and diffraction-angle-dependent light distribution in at least one plane of the system.

16. The method of claim 1, wherein a temporal development of the at least one imaging aberration is determined after the at least one imaging aberration has been determined and before the at least partial correction of the at least one imaging aberration is carried out.

17. The method of claim 16, wherein knowledge of the at least one imaging aberration is used to determine the temporal development of the at least one imaging aberration.

18. The method of claim 1, wherein a best possible correction that can be achieved is determined for at least partly correcting the at least one imaging aberration.

19. The method claim 1, wherein the positioning of the optical element comprises displacing the optical element, rotating the optical element about an optical axis of the system, and/or tilting the optical element with respect to the optical axis of the system.

20. The method of claim 1, wherein the thermal manipulator comprises at least one element selected from the group consisting of a heating wire, a Peltier element, and a heat pump.

21. The method of claim 1, wherein during i):
a first die of the wafer is exposed to light via the system while using the thermal action to deform the optical element without using the mechanical action to position or deform the optical element;
after exposing the first die to the light, using the mechanical action to position and/or deform the optical element while using the thermal action to deform the optical element; and
after using the mechanical action to position and/or deform the optical element, a second die of the wafer is exposed to the light via the system while using the thermal action to deform the optical element and without using the mechanical action to position or deform the optical element,
wherein the second die is different from the first die.

22. A semiconductor lithography system configured to be used in a method to at least partially correct at least one imaging aberration of the system while using the system to sequentially expose a plurality of dies of a wafer to light, the system comprising:
an optical element;
a mechanical manipulator configured to generate a mechanical force to position and/or deform the optical element;
a thermal manipulator configured to generate to generate a thermal force to deform the optical element;
a first controller configured to trigger the mechanical manipulator to generate the mechanical force to position and/or deform the optical element, the first controller being configured to trigger the mechanical manipulator during the method only when the system is not exposing a die of the wafer to light; and
a second controller configured to trigger the thermal manipulator to generate the thermal force to deform the optical element, the second controller being configured to constantly trigger the thermal manipulator during the method.

23. The system of claim 22, wherein the thermal manipulator comprises at least one element selected from the group consisting of a heating wire, a Peltier element, and a heat pump.

24. A method of using a semiconductor lithography system comprising a first optical element, second optical element, a mechanical manipulator, and a thermal manipulator, the method comprising:
i) at least partially correcting at least one imaging aberration of the system while using the system to sequentially expose a plurality of dies of a wafer to light, wherein during i):
a) mechanical force action generated via the mechanical manipulator is used to position and/or deform the first optical element only when not exposing a die of the wafer to light; and
b) thermal action generated via the thermal manipulator is constantly used to deform the second optical element.

25. The method of claim 24, wherein the thermal manipulator comprises at least one element selected from the group of a heating wire, a Peltier element, and a heat pump.

26. The method of claim 24, wherein during i):
a first die of the wafer is exposed to light via the system while using the thermal action to deform the optical element without using the mechanical action to position or deform the optical element;
after exposing the first die to the light, using the mechanical action to position and/or deform the optical element while using the thermal action to deform the optical element; and
after using the mechanical action to position and/or deform the optical element, a second die of the wafer is exposed to the light via the system while using the thermal action to deform the optical element and without using the mechanical action to position or deform the optical element,
wherein the second die is different from the first die.

27. The method of claim 24, wherein the mechanical force action is adjusted and/or varied in a time duration of less than 1 second.

28. The method of claim 24, wherein the at least one imaging aberration is determined before performing a) and/or b).

29. The method of claim 28, wherein the at least one imaging aberration is determined by direct measurement of a wavefront profile.

30. The method of claim 28, wherein the at least one imaging aberration is determined by estimation of a field- and diffraction-angle-dependent light distribution in the system.

31. The method of claim 28, wherein the at least one imaging aberration is determined by comparison of the field- and diffraction-angle-dependent light distribution in the system with the field- and diffraction-angle-dependent light distribution of reference measurements.

32. The method of claim 28, wherein the at least one imaging aberration is determined by measurement of the field- and diffraction-angle-dependent light distribution in at least one plane of the system.

* * * * *

UNITED STATES PATENT AND TRADEMARK OFFICE
CERTIFICATE OF CORRECTION

| | | |
|---|---|---|
| PATENT NO. | : 8,462,315 B2 | Page 1 of 1 |
| APPLICATION NO. | : 12/432921 | |
| DATED | : June 11, 2013 | |
| INVENTOR(S) | : Olaf Conradi | |

It is certified that error appears in the above-identified patent and that said Letters Patent is hereby corrected as shown below:

In the Specifications:

Column 8, Line 29, delete "m" insert --in--;

In the Claims:

Column 10, Line 40, Claim 8, delete "method claim" insert --method of claim--;

Column 11, Line 10, Claim 19, delete "method claim" insert --method of claim--;

Column 11, Line 44, Claim 22, after "configured" delete "to generate".

Signed and Sealed this
First Day of October, 2013

Teresa Stanek Rea
*Deputy Director of the United States Patent and Trademark Office*